United States Patent [19]

von Gentzkow et al.

[11] Patent Number: 5,759,690
[45] Date of Patent: *Jun. 2, 1998

[54] EPOXY RESIN MIXTURES FOR PREPREGS AND COMPOSITES

[75] Inventors: Wolfgang von Gentzkow; Jürgen Huber; Heinrich Kapitza; Wolfgang Rogler, all of Bundesrepublik. Germany

[73] Assignee: Siemens Aktiengesellschaft, München, Germany

[ * ] Notice: The term of this patent shall not extend beyond the expiration date of Pat. Nos. 5,587,243 and 5,756,638.

[21] Appl. No.: 793,287

[22] PCT Filed: Aug. 25, 1995

[86] PCT No.: PCT/DE95/01137

§ 371 Date: Mar. 10, 1997

§ 102(e) Date: Mar. 10, 1997

[87] PCT Pub. No.: WO96/07686

PCT Pub. Date: Mar. 14, 1996

[30] Foreign Application Priority Data

Sep. 9, 1994 [DE] Germany .................. 44 32 190.2

[51] Int. Cl.$^6$ ..................................... C08G 59/14
[52] U.S. Cl. ............... 428/413; 428/415; 428/417; 428/901; 523/429; 523/466; 528/27; 528/103; 528/108; 528/367; 528/368; 528/398; 528/399; 525/502; 525/504; 525/505; 525/507; 525/525
[58] Field of Search ..................... 428/413, 415, 428/417, 901; 523/429, 466; 528/27, 103, 108, 367, 368, 398, 399; 525/502, 504, 505, 507, 525

[56] References Cited

U.S. PATENT DOCUMENTS

| | | | |
|---|---|---|---|
| 2,712,001 | 6/1955 | Greenlee et al. | 260/47 |
| 2,766,139 | 10/1956 | Green, Jr. et al. | 117/103 |
| 3,373,135 | 3/1968 | Jenker et al. | 260/45.7 |
| 3,398,019 | 8/1968 | Langguth et al. | 117/138 |
| 4,111,909 | 9/1978 | Simons et al. | 528/123 |
| 4,528,359 | 7/1985 | Berman et al. | 528/109 |
| 4,618,526 | 10/1986 | Berman et al. | 428/209 |
| 5,376,453 | 12/1994 | Gentzkow et al. | 428/415 |
| 5,587,243 | 12/1996 | Von Gentzkow et al. | 428/413 |

FOREIGN PATENT DOCUMENTS

| | | |
|---|---|---|
| 0 024 332 | 8/1980 | European Pat. Off. . |
| 0 300 186 | 1/1989 | European Pat. Off. . |
| 0 384 940 | 6/1994 | European Pat. Off. . |
| 0 38 36 409 | 5/1990 | Germany . |
| 43 08 184 A1 | 9/1994 | Germany . |
| 43 08 185 A1 | 9/1994 | Germany . |
| 43 36 235 | 4/1995 | Germany . |
| 1-123.892 | 5/1989 | Japan . |
| 1 112 139 | 5/1968 | United Kingdom . |
| 86 00 627 | 1/1986 | WIPO . |

OTHER PUBLICATIONS

"Handbook of Epoxy resins", McGraw Hill Book Company, 1967, pp. 10–19.

"Der IR–Lötprozeβ aus der Sicht des Basismaterialherstellers", Von H. Schumacher, Galvanotechnik, D–88348 Saulgau, 84(1993) 11, pp. 3865–3870.

"Flame Retardancy of Polymeric Materials", vol. 1, Marcel Dekker Inc. NY, 1973, pp. 24–38, 52–61.

"Modern Plastics", vol. 47 (1970), No. 6, pp. 140 ff.

"Plastics Engineering", vol. 32 (1976), pp. 41 ff.

Encyclopedia of Polymer Science and Engineering, 2nd Ed., vol. 6, pp. 331–332.

J. Fire and Flammability, vol. 3, 1972, pp. 51–84.

H. Batzer, "Polymer e Werkstoffe" Polymer Materials, vol. III. Tech. 2, 1984.

Derwent Abstracts 94–294960, "Storage–Stable, Flame–Resistant Phosphorus–Modified Epoxy Resins" Sep. 1994.

*Primary Examiner*—Frederick Krass
*Attorney, Agent, or Firm*—Kenyon & Kenyon

[57] ABSTRACT

Epoxy resin mixtures for the production of prepregs and composites contain the following components:

- a phosphorus-modified epoxy resin with an epoxy value of 0.02 to 1 mol/100 g, made up of structural units derived from
  - (a) polyepoxy compounds with at least two epoxy groups per molecule, and
  - (b) phosphinic acid anhydrides, phosphonic acid anhydrides, or phosphonic acid half-esters;
- an amine-substituted aromatic sulfonic acid amide or hydrazide as a hardener;
- an amino hardening accelerator.

16 Claims, No Drawings

EPOXY RESIN MIXTURES FOR PREPREGS AND COMPOSITES

BACKGROUND OF THE INVENTION

The invention relates to epoxy resin mixtures for the production of prepregs and composites, as well as prepregs and composites produced from these epoxy resin mixtures.

Composites based on epoxy resins and inorganic or organic reinforcement materials have achieved great significance in many areas of technology and daily life. The reasons for this are, on the one hand, the relatively simple and safe processing of the epoxy resins, and, on the other hand, the good mechanical and chemical property profile of the hardened epoxy resin molded materials, which allows adaptation to various purposes of use and advantageous utilization of the properties of all the materials which are part of the composite.

It is advantageous for processing of epoxy resins to produce composites to take place via the production of prepregs. For this purpose, inorganic or organic reinforcement materials or Embedding components in the form of fibers, non-woven and woven materials, or of flat shaped articles, are impregnated with the resin. In most cases, this is done with a solution of the resin in a solvent which can evaporate easily or is easily volatile. The prepregs obtained as a result are not allowed to be tacky after this process, but also not hardened yet, rather the resin matrix should only be in its prepolymerized state. In addition, the prepregs must have a sufficiently long shelf life. For example, for the production of circuit boards, a shelf life of at least three months is required. During further processing to form composites, the prepregs must also melt on when the temperature is increased, and form as strong and permanent a bond as possible with the reinforcement materials or embedding components, as well as with the materials provided for the composite, under pressure, i.e. the cross-linked epoxy resin matrix must form a high level of interfacial adhesion to the reinforcement materials or embedding components, as well as to the materials to be bonded, such as metallic, ceramic, mineral, and organic materials.

In the hardened state, the composites are generally required to have high mechanical strength and thermal stability, as well as chemical resistance and heat distortion, or resistance to aging. For electrotechnical and electronic applications, the demand for permanent, high electrical insulation properties is added, and for special purposes of use, a plurality of additional requirements is added. For use as a circuit board material, for example, the requirements are great dimensional stability over a wide temperature range, good adhesion to glass and copper, high surface resistivity, low dielectric loss factor, good processing behavior (ability to be punched, drilled), low water absorption, and high corrosion resistance.

A requirement which has gained increasing importance recently is the demand for flame resistance. In many areas, this requirement has top priority, because of danger to people and property, for example in the case of construction materials for aircraft and automobile construction and for vehicles in public transport. For electrotechnical and especially electronic applications, flame resistance of circuit board materials is absolutely necessary, because of the high value of the electronic components mounted on them.

To assess the flammability, one of the toughest material tests, namely the V-0 classification according to UL 94 V, has to be passed. In this test, a test element has a defined flame applied to its lower edge, while it is vertical. The total of the burning times of ten tests is not allowed to exceed 50 s. This requirement is difficult to fulfill, particularly if the material is thin, as is the case in electronics. The epoxy resin which is in technical use worldwide for FR4 laminates only meets this requirement because it contains approximately 30 to 40% ring-brominated aromatic epoxy components, with reference to the resin, i.e. approximately 17 to 21% bromine. For other purposes of use, comparably high concentrations of halogen compounds are used, and they are often also combined with antimony trioxide as a synergist. The problem with these compounds is that while on the one hand, they are highly effective as fireproofing agents, on the other hand they have very problematic properties. For example, antimony trioxide is on the list of carcinogenic chemicals, and aromatic bromine compounds, during thermal decomposition, not only split off bromine radicals and hydrogen bromide, which result in severe corrosion, but also, if decomposition takes place in the presence of oxygen, the highly brominated aromatics, in particular, can also form highly toxic polybromine dibenzofurans and polybromine dibenzodioxins. Furthermore, the disposal of waste materials which contain bromine, and of toxic waste, causes significant difficulties.

For these reasons, there have been many attempts to replace the fireproofing agents which contain bromine with less problematic substances. For example, fillers with an extinguishing gas effect, such as aluminum oxide hydrates (see: "J. Fire and Flammability," Vol. 3 (1972), pages 51 ff.), basic aluminum carbonate (see: "Plast. Engng.," Vol. 32 (1976), pages 41 ff.), and magnesium hydroxide (EP-OS 0 243 201), as well as vitrifying fillers, such as borates (see: "Modern Plastics," Vol. 47 (1970), No. 6, pages 140 ff.), and phosphates (U.S. Pat. Nos. 2,766,139 and 3,398,019) have been proposed. But all of these fillers have the disadvantage that in part, they significantly worsen the mechanical, chemical, and electrical properties of the composites. In addition, they require special processing techniques, which are generally more complicated, since they tend towards sedimentation and increase the viscosity of the filled resin system.

The flame-retardant effect of red phosphorus has also already been described (GB patent 1,112,139), possibly in combination with microdispersed silicon dioxide or aluminum oxide hydrate (U.S. Pat. No. 3,373,135). In this connection, materials are obtained which have a limited use for electrotechnical and electronic purposes, because phosphoric acid is formed in the presence of moisture and causes corrosion. Furthermore, organic phosphorus compounds, such as phosphoric acid esters, phosphonic acid esters, and phosphines have already been proposed as flame-retardant additives (see: W. C. Kuryla and A. J. Papa, *"Flame Retardancy of Polymeric Materials,"* Vol. 1, Marcel Dekker Inc., New York, 1973, pages 24 to 38 and 52 to 61). Since these compounds are known for their "plasticizing" properties and are therefore also used worldwide as plasticizers for polymers, on a large scale (GB patent 10,794), this alternative is also not very promising.

In order to achieve flame resistance according to UL 94 V-0, it is known from DE-OS 38 36 409 to produce prepregs in such a manner that certain reinforcement materials or flat shaped articles are impregnated with a suspension of halogen-free fireproofing agents which contain nitrogen and phosphorus, in a solution of aromatic, heterocyclic and/or cycloaliphatic epoxy resins (in a non-ring-halogenated form or in a ring-halogenated form with a low halogen content) and aromatic polyamines and/or aliphatic amides as the hardener. The fireproofing agents, in this connection, are halogen-free melamine resins or organic phosphoric acid esters, particularly melamine cyanurates, melamine phosphates, triphenyl phosphate, and diphenyl cresyl phosphate, as well as mixtures of them. However, this is also not a very promising solution, because the fillers used always increase the water absorption, and therefore tests specific to circuit boards are no longer passed.

To make epoxy resins flame-retardant, organic phosphorus compounds, such as phosphorus compounds containing epoxy groups, which compounds can be anchored in the epoxy resin network, can also be used. For example, from EP patent 0 384 940, epoxy resin mixtures are known which contain commercially available epoxy resin, the aromatic polyamine 1,3,5-tris(3-amino-4-alkylphenyl)-2,4,6-trioxo-hexahydrotriazine and a phosphorus compound containing epoxy groups, based on glycidyl phosphate, glycidyl phosphonate, or glycidyl phosphinate. With such epoxy resin mixtures, it is possible to produce flame retardant laminates or composites which can be classified according to UL 94 V-0, and have a glass transition temperature of >200° C., without adding any halogen. In addition, these epoxy resin mixtures can be processed in a manner comparable to that for the epoxy resins which are in use.

Circuit boards are the basis for the production of electronic assemblies. They serve to connect various electronic and microelectronic components with one another, to form electronic circuits. In this connection, the components are connected with the circuit board by being glued or soldered onto it, by means of complex, highly automated assembly processes. In automatic insertion, there is also a trend in the direction of more and more efficient production methods. Therefore IR reflow soldering is being increasingly used in SMD technology, and will replace the other soldering methods to a great extent in the future. In this method, the entire circuit board is heated to temperatures >260° C. within a few seconds, by means of IR irradiation; any water absorbed in the circuit board is suddenly evaporated. Only laminates with very good interlaminar adhesion survive IR soldering processes without destruction due to delamination. To reduce this risk, complicated conditioning processes have been proposed (see in this regard: "Galvanotechnik," [Galvanotechnology], Vol. 84 (1993), pages 3865 to 3870).

The so-called multilayer circuit boards (ML) especially, which represent a major portion of circuit boards being produced today, are critical in this regard. These circuit boards contain a plurality of structured conductor planes which are spaced apart and insulated from one another by means of epoxy resin composites. Now the trend in ML technology is going in the direction of ever higher numbers of structured conductor planes; for example, multilayer circuit boards with more than 20 structured conductor planes are currently being produced. Since an overly high overall thickness of these circuit boards must be avoided for technical reasons, the distance between the structured conductor planes is becoming smaller and smaller, and therefore the interlaminar adhesion and the copper adhesion of ML laminates is becoming more and more problematic. In IR soldering on this type of circuit boards, there are also high demands with regard to solder bath resistance.

From EP patent 0 384 940, as already mentioned, it is known that laminates with a flame-resistance in accordance with requirements can be produced, without halogen, by phosphorus modification of impregnation resins. In production tests, however, it has been shown that there is a risk of delamination during IR soldering for phosphorus-modified laminates. There is therefore an urgent need for electrolaminates which, on the one hand, achieve the necessary flame resistance without halogens, for example by inclusion of phosphorus in the resin matrix, and, on the other hand, are suitable for IR soldering as it has been introduced in SMD technology. Electrolaminates with an extremely high solder bath resistance are required for this purpose.

In circuit board technology, the high-pressure cooker test (HPCT) and the determination of the so-called solder bath resistance are particularly used to test the suitability of laminates for high thermal stressing. In the HPCT, a laminate sample (5×5 cm) from which the copper has been removed is put under stress at 120° C. and approximately 1.4 bar steam pressure for 2 h, and subsequently allowed to float in a solder bath at 260° C., where the time until delamination is measured. High-quality laminates demonstrate no delamination up to >20 s. The solder bath resistance is determined using laminate samples with a size of 2×10 cm, in that they are dipped in a solder bath at 288° C., and the time until delamination is determined.

SUMMARY OF THE INVENTION

It is the task of the invention to indicate technically simple and therefore inexpensively accessible epoxy resin mixtures which can be processed in a manner comparable to the epoxy resins which are currently in technical use, and are suitable for the production of prepregs and laminates for multilayer technology, which result in highly flame-retardant molded materials, i.e. molded materials that can be classified according to the UL 94 V specification, without halogen, and, at the same time, demonstrate such a high level of solder bath resistance that IR soldering processes are possible during electronic assembly construction, without delamination.

DETAILED DESCRIPTION OF THE INVENTION

This task is accomplished, according to the invention, by the fact that the epoxy resin mixtures contain the following components:

a phosphorus-modified epoxy resin with an epoxy value of 0.02 to 1 mol/100 g, made up of structural units derived from
  (A) polyepoxy compounds with at least two epoxy groups per molecule, and
  (B) phosphinic acid anhydrides, phosphonic acid anhydrides, or phosphonic acid half-esters;

an aromatic amine with the following structure as a hardener:

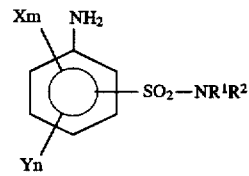

where the following applies:

X is a H atom and Y is an alkyl group with 1 to 3 C atoms and m and n each stand for a whole number from 0 to 4, with the stipulation that m+n=4, the radicals $R^1$ and $R^2$ are, independent of each other, a H atom or an alkyl group with 1 to 3 C atoms, or one of the radicals $R^1$ or $R^2$ has this significance and the other radical is an $NR^3R^4$ group with $R^3$ or $R^4$=H or alkyl with 1 to 3 C atoms;

an amino hardening accelerator.

The phosphorus-modified epoxy resins contained in the epoxy resin mixtures according to the invention are produced by reaction of commercially available polyepoxy resins (polyglycidyl resins) with the following phosphorus compounds:

Phosphinic acid anhydrides: Anhydrides of phosphinic acids with alkyl, alkenyl, cycloalkyl, aryl or aralkyl radicals;

the following can be mentioned as examples: dimethyl phosphinic acid anhydride, methyl ethyl phosphinic acid anhydride, diethyl phosphinic acid anhydride, dipropyl phosphinic acid anhydride, ethyl phenyl phosphinic acid anhydride, and diphenyl phosphinic acid anhydride;

Bis-phosphinic acid anhydrides: Anhydrides of bis-phosphinic acids, particularly of alkane-bis-phosphinic acids with 1 to 10 carbon atoms in the alkane grouping; the following can be mentioned as examples: methane-1,1-bis-methyl phosphinic acid anhydride, ethane-1,2-bis-methyl phosphinic acid anhydride, ethane-1,2-bis-phenyl phosphinic acid anhydride, and butane-1,4-bis-methyl phosphinic acid anhydride;

Phosphonic acid anhydrides: Anhydrides of phosphonic acid with alkyl, alkenyl, cycloalkyl, aryl or aralkyl radicals;

the following can be mentioned as examples:

methane phosphonic acid anhydride, ethane phosphonic acid anhydride, propane phosphonic acid anhydride, hexane phosphonic acid anhydride, and benzene phosphonic acid anhydride;

Phosphonic acid half-esters: Preferably, half-esters, i.e. mono-esters of phosphonic acids with alkyl radicals (preferably with 1 to 6 carbon atoms) or with aryl radicals (particularly benzene phosphonic acid) with aliphatic alcohols, particularly aliphatic alcohols with a low boiling point, such as methanol and ethanol, are used;

the following can be mentioned as examples: methane phosphonic acid monomethyl ester, propane phosphonic acid monoethyl ester, and benzene phosphonic acid monomethyl ester;

phosphonic acid half-esters can be produced by partial hydrolysis of the corresponding phosphonic acid diesters, particularly by means of sodium hydroxide solution, or by partial esterification of the free phosphonic acids with the corresponding alcohol.

The production of phosphorus-modified epoxy resins of the type stated is also described in the German Offenlegungsschriften 0 43 08 184 and 43 08 185.

Both aliphatic and aromatic glycidyl compounds as well as mixtures of them can generally be used for the production of the phosphorus-modified epoxy resins. Preferably, bisphenol-A-diglycidyl ether, bisphenol-F-diglycidyl ether, polyglycidyl ethers of phenol/formaldehyde and cresol/formaldehyde novolaks, diglycidyl esters of phthalic, isophthalic, terephthalic, and tetrahydrophthalic acid as well as mixtures of these epoxy resins are used. Other polyepoxides which can be used are described in the "*Handbook of Epoxy Resins*" by Henry Lee and Kris Neville, McGraw-Hill Book Company 1967, and in the monograph by Henry Lee, "*Epoxy Resins,*" American Chemical Society 1970.

From the range of possible phosphorus-modified epoxy resins, phosphonic acid-modified epoxy resins, such as methyl, ethyl, and propyl phosphonic acid-modified epoxy resins, particularly with a phosphorus content between 2 and 5 mass %, have proven to be particularly advantageous for the production of solder-bath-resistant electrolaminates. Furthermore, phosphorus-modified epoxy resins with at least one epoxy functionality, on average, particularly those with at least two epoxy functionalities, on average, are advantageous. Such phosphorus-modified epoxy resins can be produced by reaction of epoxy novolak resins with a functionality of approximately 3 to 4 with phosphonic acid anhydrides. The phosphorus-modified epoxy resins contain 0.5 to 13 mass % phosphorus, preferably 1 to 8 mass %. The phosphorus content of the epoxy resin mixtures in total, i.e. the impregnation resin mixtures, is 0.5 to 5 mass %, preferably 1 to 4 mass %.

It is advantageous if the epoxy resin mixtures according to the invention additionally contain a phosphorus-free epoxy resin or a compound free of glycidyl groups, with phenolic OH groups. The phosphorus-free epoxy resin is obtained by reaction of bisphenol-A diglycidyl ether with a deficit of bisphenol-A. The compound free of glycidyl groups is bisphenol-A, bisphenol-F or a phenoxy resin with high molecular weight, which is produced by condensation of bisphenol-A or bisphenol-F with epichlorohydrin.

The addition of the phosphorus-free epoxy resin serves to achieve certain properties of the laminates produced from the epoxy resin mixtures. The production and the structure of such solid resins is described in H. Batzer, "*Polymere Werkstoffe*" [*Polymer Materials*], Volume III (*Technology* 2), Georg Thieme Verlag, Stuttgart, 1984, pages 178 ff. These are chain-lengthened bisphenol-A diglycidyl ethers with a higher molecular weight, with an epoxy value of 0.22 to 0.29 equivalent/100 g. In the epoxy resin mixtures according to the invention, phosphorus-free epoxy resins with an epoxy value of 0.22 to 0.25 equivalent/100 g are preferably used. The viscosity of these resins, measured at 120° C., lies between 200 and 900 mpa·s. The content of the phosphorus-free epoxy resin in the mixture, in total, lies between 0 and 30 mass %, preferably between 0 and 10 mass %. The phosphorus-free epoxy resin component is only allowed to be added in such an amount that the total mixture still contains sufficient phosphorus so that the requirement regarding flame resistance according to the UL 94 V specification is still met. In the presence of phosphorus-modified epoxy resins with a high phosphorus content, it is therefore possible to add more phosphorus-free epoxy resin than in the case of epoxy resins with a low phosphorus content.

The addition of the compound free of glycidyl groups, with phenolic OH groups, also takes place to achieve certain properties. Bisphenol-A and bisphenol-F as well as phenoxy resins serve for this purpose. These are linear condensation products of bisphenol-A or bisphenol-F and epichlorohydrin, in the form of compounds with a high molecular weight up to 30,000; the content of end-position phenolic OH functions, at <<1%, is very slight. The production and properties of such phenoxy resins are known (see in this regard: "*Encyclopedia of Polymer Science and Engineering,*" (Second Edition), Vol. 6, pages 331 and 332, John Wiley & Sons, Inc., 1986). The compound with phenolic OH groups is added to the epoxy resin mixtures according to the invention in amounts of 0 to 20 mass %, preferably 0 to 10 mass %. Here again, it must be taken into consideration that the phenolic component free of glycidyl groups is only allowed to be mixed in up to a proportion at which the requirement concerning flame resistance according to the UL 94 V specification is still met.

As hardeners, amine-substituted aromatic sulfonic acid amides and hydrazides are used in the epoxy resin mixtures according to the invention. Examples of such hardeners are 2-aminobenzene sulfonic acid amide, 4-aminobenzene sulfonic acid amide (sulfanilamide), 4-aminobenzene sulfonic acid dimethyl amide, 4-amino-2-methyl benzene sulfonic acid amide, and 4-aminobenzene sulfonic acid hydrazide, as well as mixtures of these compounds.

The hardener component is added in concentrations such that the equivalent ratio between epoxy functions and NH functions amounts to 1:0.4 to 1:1.1 in the epoxy resin mixtures according to the invention, preferably 1:0.5 to 1:0.8. When a phenolic component which is phosphorus-free is added, it must be taken into consideration that the concentration of the epoxy groups is decreased in accordance with the content of phenolic OH groups. In general, the content of hardener in the resin mixture amounts to 0.5 to 35 mass %, preferably 2 to 12 mass %. The use of hardener components of the type mentioned allows the production of laminates with a significantly better solder bath resistance than is the case when using the usual hardener in circuit board technology, namely dicyanodiamide, in the same epoxy resin mixtures.

From U.S. Pat. No. 4,618,526, hardenable reaction resin mixtures, based on aromatic polyglycidyl compounds, are known, which can be hardened with amine-substituted sulfonamides, such as sulfanilamide. While these mixtures are also suitable for the production of laminates, these laminates are unsuitable as electrolaminates, according to current requirements, since they do not demonstrate any flame resistance according to UL 94 V. WO 86/00627 describes epoxy resin mixtures which can also be hardened with sulfanilamide and processed to produce electrolaminates. However, the mixtures contain halogen components, so that these laminates also do not meet today's requirements in electrical engineering, for flame resistance without the addition of halogen.

The tertiary amines and imidazoles usually used for hardening epoxy resins serve as amino hardening accelerators. Suitable amines are, for example, tetramethyl ethylene diamine, dimethyl octyl amine, dimethylamino ethanol, dimethyl benzyl amine, 2,4,6-tris(dimethylamino methyl) phenol, N,N'-tetramethyl diamino diphenyl methane, N,N'-dimethyl piperazine, N-methyl morpholine, N-methyl piperidine, N-ethyl pyrrolidine, 1,4-diazobicyclo (2,2,2,)-octane, and quinolines. Suitable imidazoles are, for example, 1-methyl imidazole, 2-methyl imidazole, 1,2-dimethyl imidazole, 1,2,4,5-tetramethyl imidazole, 2-ethyl-4-methyl imidazole, 1-cyanoethyl-2-phenyl imidazole, and 1-(4,6-diamino-s-triazinyl-2-ethyl)-2-phenyl imidazole. The accelerator is added in a concentration of 0.01 to 2 mass %, preferably 0.05 to 1 mass %, with reference to the epoxy resin mixture in each instance.

For prepreg production, the various components—separately or together—are dissolved in inexpensive solvents, such as acetone, methyl ethyl ketone, ethyl acetate, methoxy ethanol, dimethyl formamide, and toluene, or in mixtures of such solvents, and if necessary combined to yield a solution. The solution is then processed on conventional impregnation facilities, i.e. used to impregnate fibers of inorganic or organic materials, such as glass, metal, minerals, carbon, aramide, polyphenylene sulfide, and cellulose, as well as woven or non-woven fabrics produced from them, or to coat flat shaped articles, such as metal foils or plastic films. If necessary, the impregnation solutions can also contain other halogen-free additives which improve flame resistance, some of which can be homogeneously dissolved or dispersed. Such additives can be, for example, melamine cyanurates, melamine phosphates, powdered polyether imide, polyether sulfone, and polyimide.

For the production of prepregs for circuit board technology, glass-fiber fabric is primarily used. For multi-layer circuit boards, prepregs made of glass-fiber fabric types with a surface density of 25 to 200 g/m$^2$ are especially used. Using impregnation solutions of the type indicated above, it is also possible to produce prepregs with low surface densities, in accordance with the requirements. The impregnated or coated reinforcement materials or embedding components are dried at an elevated temperature, at which the solvent is removed, on the one hand, and prepolymerization of the impregnation resin takes place, on the other hand. In total, an extremely advantageous ratio of effort and expense to achievable properties can be obtained in this way.

The coatings and prepregs obtained are non-tacky and are stable in storage at room temperature for a period of three months and more, i.e. they demonstrate a sufficiently long shelf life. They can be pressed into composites at temperatures up to 220° C., and these composites are characterized by high glass transition temperatures up to 170° C., and by inherently flame resistance. If glass-fiber fabrics with a mass proportion of 60 to 62%, with reference to the laminate, are used as the embedding material, the composite passes the burning test according to UL 94 V, without the addition of halogen compounds or other flame-retardant additives, even for test elements with a wall thickness of 1.6 mm or even 0.8 mm, with definite classification in V-0. In this connection, it proves to be particularly advantageous that no corrosive or, in particular, toxic cleavage products are formed, and that smoke development is greatly reduced, in comparison with other polymer materials, particularly in comparison with epoxy resin molded materials which contain bromine.

The invention will be explained in greater detail below, on the basis of exemplary embodiments (MP=parts by mass).

EXAMPLES 1 and 2

Production of Prepregs

A solution of A MP of a phosphorus-modified epoxy resin (P/EP resin) in the form of a reaction product (epoxy value: 0.34 mol/100 g; phosphorus content: 3.2%) produced from an epoxidized novolak (epoxy value: 0.56 mol/100 g; average functionality: 3.6) and propane phosphonic acid anhydride—in D MP methyl ethyl ketone (MEK), E MP dimethyl formamide (DMF), and F MP ethyl acetate (EA) —is mixed with B MP sulfanilamide (SulfAm) and C MP 2-methyl imidazole (MeIm). The mixture is stirred at room temperature for approximately 15 min, until a clear solution is formed. Using this solution, glass-fiber fabrics (fabric type 7628; surface density: 197 g/m$^2$) were continuously impregnated using a laboratory impregnation facility, and dried in a vertical drying facility at temperature from 50° to 160° C. Prepregs produced in this way are non-tacky and stable in storage at room temperature (at max. 21° C. and max. 50% relative humidity). The composition of the impregnation resin solutions and the properties of the prepregs are shown in Table 1.

EXAMPLES 3 to 5

Production of Prepregs

A solution of G MP of a reaction product (epoxy value: 0.32 mol/100 g; phosphorus content: 3.8%) produced from an epoxidized novolak (epoxy value: 0.56 mol/100 g; average functionality: 3.6) and propane phosphonic acid anhydride—in D MP methyl ethyl ketone (MEK), E MP dimethyl formamide (DMF), and F MP ethyl acetate (EA) —is mixed with B MP sulfanilamide (SulfAm) and C MP 2-methyl imidazole (MeIm). H MP bisphenol-A (bis-A) or I MP Araldit B (epoxy value: 0.25 equivalent/100 g; viscosity at 120° C.: 380 mPa·s), i.e. a commercially available epoxy resin with a higher molecular weight, based on bisphenol-A (Aral B), or J MP of a phenoxy resin with a molecular weight of 30.000 and a hydroxyl value of 6% (phen resin) are added to the solution obtained. The composition of the impregnation resin solutions and the properties of the prepregs produced from them, analogous to Examples 1 and 2, are shown in Table 1.

TABLE 1

Composition of the impregnation resin solutions and properties of the prepregs

| Example No. | 1 | 2 | 3 | 4 | 5 | 6 |
|---|---|---|---|---|---|---|
| Component (MP): | | | | | | |
| A (P/EP resin) | 90 | 90 | — | — | — | 90 |
| B (SulfAm) | 11 | 7 | 8 | 8 | 8 | — |
| C (MeIm) | 0.1 | 0.1 | 0.1 | 0.1 | 0.1 | 0.2 |
| D (MEK) | 40 | 40 | 40 | 40 | 40 | 40 |
| E (DMF) | 10 | 10 | 20 | 20 | 20 | 10 |
| F (EA) | 5 | 5 | 6 | 6 | 6 | 5 |
| G (P/EP resin) | — | — | 90 | 90 | 90 | — |
| H (bis-A) | — | — | 11 | — | — | — |
| I (Aral B) | — | — | — | 11 | — | — |
| J (phen resin) | — | — | — | — | 11 | — |
| K (dicy) | — | — | — | — | — | 5 |
| Measured values: | | | | | | |
| Residual content of solvent (%) | 0.1 | 0.2 | 0.2 | 0.2 | 0.1 | 0.22 |
| Residual gel time of the prepregs at 170° C. (s) | 110 | 120 | 130 | 115 | 107 | 110 |

The residual gel time is determined in that impregnation resin (0.2 to 0.3 g) which has been mechanically removed from the prepregs and is free of glass fibers is applied to a hotplate pre-heated to 170° C. After approximately 30 s, the melted resin sample is uniformly stirred with a glass or wood rod. The change in viscosity is observed by pulling filaments with a length of about 50 mm from the melt. Gelling has occurred if no filaments can be drawn any longer. The time span (in s) from application of the resin to the hotplate until premature tear of the filaments, determined using a stopwatch, is the gel time.

EXAMPLE 6

Comparison Test

A solution of A MP of a reaction product (epoxy value: 0.34 mol/100 g; phosphorus content: 3.2%) produced from an epoxidized novolak (epoxy value: 0.56 mol/100 g; average functionality: 3.6) and propane phosphonic acid anhydride (P/EP resin)—in D MP methyl ethyl ketone (MEK), E MP dimethyl formamide (DMF), and F MP ethyl acetate (EA)—is mixed with K MP dicyanodiamide (Dicy) and C MP 2-methyl imidazole (MeIm). The resin solution obtained is processed to yield prepregs, analogous to Examples 1 and 2. The composition of the impregnation resin solution and the properties of the prepregs are shown in Table 1.

EXAMPLES 7 to 11

Influence of the Accelerator Concentration

The method of procedure is analogous to Examples 1 and 2, but the impregnation resin solutions are mixed with different parts by mass of 2-methyl imidazole (C). The so-called B time, i.e. the gel time at 170° C., of the impregnation resin solutions is shown in Table 2.

TABLE 2

Reactivity of the impregnation resin solution

| Example No. | 7 | 8 | 9 | 10 | 11 |
|---|---|---|---|---|---|
| C (MP)*) | — | 0.05 | 0.1 | 0.2 | 0.4 |
| B time at 170° C. (s) | 840 | 400 | 305 | 220 | 160 |

*)Composition of the impregnation solution as in Example 1 (see Table 1).

EXAMPLES 12 to 17

Production and Testing of Laminates

Prepregs produced in accordance with Examples 1 to 6 (glass-fiber fabric type 7628; surface density: 197 g/m$^2$) are pressed together to form laminates with a thickness of 1.5 to 1.6 mm, consisting of eight layers of prepregs, laminated on both sides with a 35 μm Cu foil (pressing parameters: 175° C., 30 to 35 bar, 40 min); subsequently, postbaking takes place for 2 h at 190° C. The glass transition temperature $T_G$ is determined for the laminates (using DMTA, i.e. dynamic-mechanical analysis), the mean burning time is determined according to UL 94 V, and the adhesion capacity of the copper foil, the Measling test, the high-pressure cooker test, and the solder bath resistance are determined. The values obtained are shown in Table 3.

TABLE 3

Properties of the laminates

| | Example No. | | | | | |
|---|---|---|---|---|---|---|
| | 12 | 13 | 14 | 15 | 16 | 17 |
| | Prepregs in accordance with Example No. | | | | | |
| Measured values: | 1 | 2 | 3 | 4 | 5 | 6 |
| $T_G$ (°C.) | 172 | 153 | 143 | 140 | 144 | 170 |
| mean burning time acc. to UL 94 V (s) | 4.0 | 3.3 | 4.2 | 4.3 | 4.4 | 4.9 |
| Classification | V-0 | V-0 | V-0 | V-0 | V-0 | V-0 |
| Adhesion capacity of the Cu foil at RT (N/mm) | 1.9 | 1.8 | 2.2 | 2.0 | 2.1 | 1.9 |
| Measling test (LT26) | + | + | + | + | + | − |
| High-pressure cooker test (s) | >20 | >20 | >20 | >20 | >20 | 9 |
| Solder bath resistance at 228° C. (s) | >600 | >600 | >600 | >600 | >600 | 85 |

The tests conducted on the laminates take place as follows:

Adhesion capacity of the copper lamination

A strip of the copper foil, 25 mm wide and 100 mm long, is removed from the glass-reinforced laminate over a length of 20 mm, and pulled away vertically, using a suitable device, at a take-off speed of 50 mm/min; the force F(N) required to do this is measured.

Measling test

The test takes place using specimens without copper lamination (size: 20 mm×100 mm). The specimens are dipped in an LT26 solution (composition: 850 ml deionized H$_2$O, 50 ml HCl p.a., 100 g SnCl$_2$·2 H$_2$O, 50 gram thiourea), at a temperature of 65° C., for 3 min, rinsed with running water, and subsequently placed in boiling water for 20 min.

After being dried in air (2 to 3 min), the sample is dipped in a solder bath at a temperature of 260° for 10 s. The laminate is not permitted to delaminate.

High-pressure cooker test

Two specimens with a size of 50 mm×50 mm are kept in a steam atmosphere at a temperature of 120° to 125° C. in a high-pressure autoclave for 2 h. Afterwards, within two minutes [of being removed from the autoclave], the dried samples are placed on a solder bath with a temperature of 260° C. for 20 s. The specimens are not permitted to delaminate.

Solder bath resistance

The test takes place according to DIN IEC 259, using a solder bath according to Section 3.7.2.3. Specimens with a size of 25 mm×100 mm are used, which are dipped into a solder bath with a temperature of 288° C., and the time until delamination or until bubbles occur is measured.

What is claimed is:

1. An epoxy resin mixture for the production of prepregs and composites, comprising:
   a phosphorus-modified epoxy resin with an epoxy value of 0.02 to 1 mol/100 g, which is a reaction product of (a) and (b)
   (a) polyepoxy compounds with at least two epoxy groups per molecule, and
   (b) phosphinic acid anhydrides, phosphonic acid anhydrides, or phosphonic acid half-esters;
   an aromatic amine with the following structure as a hardener:

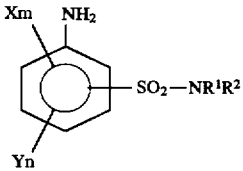

wherein:
   X is a H atom and Y is an alkyl group with 1 to 3 C atoms and m and n each stand for a whole number from 0 to 4, where m+n=4,
   the radicals $R^1$ and $R^2$ are, independent of each other, a H atom or an alkyl group with 1 to 3 C atoms, or one of the radicals $R^1$ or $R^2$ has this significance and the other radical is an $NR^3R^4$ group with $R^3$ or $R^4$=H or alkyl with 1 to 3 C atoms; and
   an amino hardening catalyst.

2. The epoxy resin mixture according to claim 1, which contains a phosphorus-free epoxy resin, produced by reaction of bisphenol-A diglycidyl ether with a deficit of bisphenol-A, or a compound free of glycidyl groups, with phenolic OH groups, in the form of bisphenol-A, bisphenol-F or a phenoxy resin, obtained by condensation of bisphenol-A or bisphenol-F with epichlorohydrin.

3. The epoxy resin mixture according to claim 2, wherein the proportion of the phosphorus-free epoxy resin in the resin mixture amounts to as much as 30 mass %.

4. The epoxy resin mixture according to claim 3, wherein the proportion of the phosphorous-free epoxy resin in the resin mixture amounts to as much as 10 mass %.

5. The epoxy resin mixture according to claim 2, wherein the proportion of the compound free of glycidyl groups in the resin mixture amounts to as much as 20 mass %.

6. The epoxy resin mixture according to claim 5, wherein the proportion of the compound free of glycidyl groups in the resin mixture amounts to as much as 10 mass %.

7. The epoxy resin mixture according to claim 1, wherein the phosphorus content amounts to 0.5 to 5 mass %, with reference to the resin mixture.

8. The epoxy resin mixture according to claim 7, wherein the phosphorus content amounts to 1 to 4 mass %, with reference to the resin mixture.

9. The epoxy resin mixture according to claim 1, wherein the equivalent ratio between epoxy functions and NH functions is 1:0.4 to 1:1.1.

10. The epoxy resin mixture according to claim 9, wherein the equivalent ratio between epoxy functions and NH functions is 1:0.5 to 1:0.8.

11. The epoxy resin mixture according to claim 1, wherein the content of hardener in the resin mixture amounts to 0.5 to 35 mass %.

12. The epoxy resin mixture according to claim 11, wherein the content of hardener in the resin mixture amounts to 2 to 12 mass %.

13. The epoxy resin mixture according to claim 1, wherein the hardener is 2-aminobenzene sulfonic acid amide, 4-aminobenzene sulfonic acid amide, 4-aminobenzene sulfonic acid dimethyl amide, 4-amino-2-methyl benzene sulfonic acid amide, or 4-aminobenzene sulfonic acid hydrazide.

14. A prepreg based on inorganic or organic reinforcement materials in the form of fibers, non-woven or woven materials, or flat shaped articles, produced from the epoxy resin mixture according to claim 1.

15. A composite based on inorganic or organic reinforcement materials in the form of fibers, non-woven or woven materials, or flat shaped articles, produced from the epoxy resin mixture according to claim 1.

16. A circuit board made of prepregs, produced from glass fiber fabrics and the epoxy resin mixture according to claim 1.

* * * * *